United States Patent
Terahara et al.

(10) Patent No.: US 6,979,610 B2
(45) Date of Patent: Dec. 27, 2005

(54) SEMICONDUCTOR DEVICE FABRICATION METHOD

(75) Inventors: Masanori Terahara, Kawasaki (JP); Hiroshi Morioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 63 days.

(21) Appl. No.: 10/694,984

(22) Filed: Oct. 29, 2003

(65) Prior Publication Data
US 2004/0092082 A1    May 13, 2004

(30) Foreign Application Priority Data
Oct. 30, 2002   (JP)   ............................. 2002-315183

(51) Int. Cl.⁷ .......................................... H01L 21/8238
(52) U.S. Cl. ...................... 438/221; 438/296; 438/424
(58) Field of Search ................. 438/221, 296, 438/424; 257/510, 506

(56) References Cited

U.S. PATENT DOCUMENTS

| | | | |
|---|---|---|---|
| 6,696,365 B2 * | 2/2004 | Kumar et al. | 438/706 |
| 2002/0019114 A1 * | 2/2002 | Trivedi | 438/428 |
| 2002/0024111 A1 * | 2/2002 | Shin | 257/500 |

FOREIGN PATENT DOCUMENTS

| | | |
|---|---|---|
| JP | 2000-269192 | 9/2000 |
| JP | 2001-44274 | 2/2001 |
| JP | 2001-176841 | 6/2001 |

* cited by examiner

Primary Examiner—Hsien-Ming Lee
(74) Attorney, Agent, or Firm—Westerman, Hattori, Daniels & Adrian, LLP

(57) ABSTRACT

The semiconductor device fabrication method comprises the step of forming a first insulation film 14 over a semiconductor substrate 10; the step of forming a semiconductor film 16 over the first insulation film 14; the step of forming a resist film 20 over the semiconductor film 16; the step of forming openings 21 in the resist film 20; the step of etching the semiconductor film 16 with the resist film 20 as the mask; the step of etching the first insulation film 14 with the semiconductor film 16 as the mask; and the step of etching the semiconductor substrate 10 with the first insulation film 14 as the mask to form trenches 22 in the semiconductor substrate 10. Silicon nitride film is patterned, using a mask of polysilicon film, whereby the silicon nitride film can be etched with high selectivity to the polysilicon film. Accordingly, a good pattern of the silicon nitride film can be formed. Even when micronized trenches are formed in a semiconductor substrate with silicon nitride film as a mask, the trenches can be formed in a required configuration. Thus, good element isolation regions can be formed, further micronized.

20 Claims, 7 Drawing Sheets

SEMICONDUCTOR DEVICE FABRICATION METHOD

CROSS-REFERENCE TO RELATED APPLICATION

This application is based upon and claims priority of Japanese Patent Application No. 2002-315183, filed on Oct. 30, 2002, the contents being incorporated herein by reference.

BACKGROUND OF THE INVENTION

The present invention relates to a semiconductor device fabrication method, more specifically a semiconductor fabrication method which can contribute to the micronization of semiconductor devices.

As a technique of forming element isolation regions defining element regions, LOCOS (LOCal Oxidation of Silicon) is conventionally widely known.

However, when element isolation regions are formed by LOCOS, the element regions tend to be small due to bird's beaks. Making an oxidation amount small when element isolation regions are made can make the bird's beaks small. However, small oxidation amounts make the element isolation function insufficient. When element isolation regions are formed by LOCOS, large steps are formed on the substrate surface. The technique of forming element isolation regions by LOCOS makes it further micronization and higher integration impossible.

Recently, STI (Shallow Trench Isolation) is proposed in place of LOCOS. The method of forming element isolation regions by STI will be explained with reference to FIGS. 6A to 7C. FIGS. 6A to 7C are sectional views of a semiconductor device in the steps of the proposed semiconductor device fabrication method, which show the method.

First, as shown in FIG. 6A, a silicon oxide film 112, a silicon nitride film 1114 and a anti-reflection film 116 are formed sequentially on a semiconductor substrate 110. Then, a photoresist film 120 is formed on the anti-reflection film 118. Next, openings 121 are opened in the photoresist film 120 down to the anti-reflection film 116.

Then, as shown in FIG. 6B, with the photoresist film 120 as the mask, the anti-refection film 118 is etched.

Next, as shown in FIG. 6C, with the photoresist film 120 as the mask, the silicon nitride film 114 is sequentially etched.

Then, as shown in FIG. 7A, the photoresist film 120 is released.

Next, as shown in FIG. 7B, with the silicon nitride film 114 as the mask, the semiconductor substrate 110 is etched to thereby form trenches 122, i.e., grooves.

Then, a silicon oxide film is formed in the trenches 122 and on the silicon nitride film 114. Then, the silicon oxide film 126 is polished by CMP (Chemical Mechanical Polishing) until the silicon nitride film 114 is exposed. Element isolation regions 128 of the silicon oxide film 126 are thus buried in the trenches 122. Thus, element regions 130 are defined by the element isolation regions 128 (refer to FIG. 7C).

Then, the silicon nitride film 114 and the silicon oxide film 112 are removed, and transistors (not shown) are fabricated in the element regions 130. Thus, a semiconductor device is fabricated.

Forming the element isolation regions 128 by STI prohibits the generation of bird's beak which is generated in forming element isolation regions by LOCOS, whereby the decrease of the element regions 130 can be prevented. Making the trenches 122 deeper can make the effective inter-element distance longer, whereby higher element isolation function can be provided.

Following references disclose the background art of the present invention.

[Patent Reference 1]
Specification of Japanese Patent Application Unexamined Publication No. 2000-269192

[Patent Reference 2]
Specification of Japanese Patent Application Unexamined Publication No. 2001-176841

[Patent Reference 3]
Specification of Japanese Patent Application Unexamined Publication No. 2001-44274

However, the proposed semiconductor device fabrication method cannot further micronize semiconductor devices. That is, in order to further micronize semiconductor devices, the photoresist film 120 must be patterned into smaller width. However, when the silicon nitride film 114 is dry etched, using the photoresist film 120 of a narrow width, the photoresist film 120 often collapses. On the other hand, when the photoresist film 120 is formed thin, the photoresist film 120 is prevented from collapsing, but the selectivity of etching the silicon nitride film 114 to the photoresist film 120 is not always high, and while the silicon nitride film 114 is etching, the photoresist film 120 is gradually extinguished. In such case, the shoulders of the silicon nitride film 114 are much scraped, or the side wall of the silicon nitride film 114 is roughened. That is, the silicon nitride film 114 cannot be patterned into a required configuration. The silicon nitride film 114 cannot be patterned into a required pattern, and accordingly the trenches cannot be formed into a required configuration.

Here, setting the film thickness of the silicon nitride film 114 to be small allows the silicon nitride film 114 to be patterned in a shorter period of time and could solve the above-described problems. However, the silicon nitride film 114, which functions as the stopper film for polishing the silicon oxide film 126 by CMP, must be formed in a uniform and sufficient film thickness, when the silicon nitride film 114 is polished. Accordingly, it is not preferable to set the film thickness of the silicon nitride film 114 to be small.

SUMMARY OF THE INVENTION

An object of the present invention is to provide a semiconductor device fabrication method which can further micronize good element isolation regions.

According to one aspect of the present invention, there is provided a method for fabricating a semiconductor device comprising the steps of: forming a first insulation film over a semiconductor substrate; forming a semiconductor film over the first insulation film; forming a resist film over the semiconductor film; forming openings in the resist film; etching the semiconductor film with the resist film as a mask; etching the first insulation film with the semiconductor film as a mask; and etching the semiconductor substrate with the first insulation film as a mask to form trenches in the semiconductor substrate.

According to the present invention, silicon nitride film is patterned, using a mask of polysilicon film, whereby the silicon nitride film can be etched with high selectivity to the polysilicon film. Accordingly, a good pattern of the silicon nitride film can be formed. According to the present invention, even when micronized trenches are formed in a semiconductor substrate with silicon nitride film as a mask, the trenches can be formed in a required configuration. Thus, according to the present invention, further micronized good element isolation regions can be formed.

DETAILED DESCRIPTION OF THE INVENTION

[One Embodiment]

The semiconductor device fabrication method according to one embodiment of the present invention will be explained with reference to FIGS. 1A to 5C. FIGS. 1A to 5C are sectional view of a semiconductor device in the steps of the semiconductor fabrication method according to the present embodiment, which show the method.

Figure 1A:
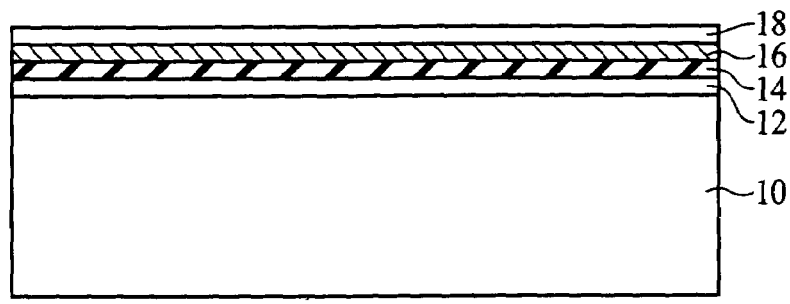
FIGS. 1A to 1C are sectional views of a semiconductor device in the steps of the semiconductor fabrication method according to one embodiment of the present invention, which show the method (Part 1).

First, as shown in FIG. 1A, a silicon oxide film 12 is formed on the entire surface of a semiconductor substrate 10 of silicon by, e.g., thermal oxidation. The film thickness of the silicon oxide film 12 is, e.g., about 10 nm. The silicon oxide film 12 functions as a buffer film for mitigating stresses between the silicon nitride film 14 and the silicon substrate 10.

Next, a silicon nitride film 14 is formed on the entire surface by, e.g., CVD. The film thickness of the silicon nitride film 14 is, e.g., 112 nm. The silicon nitride film 14 functions as the mask for etching the semiconductor substrate 10 to form trenches 22 (refer to FIG. 3B) in a later step. The silicon nitride film 14 functions as the stopper film for polishing the silicon oxide film 12 in a later step.

Next, a polysilicon film 16 is formed on the entire surface of the silicon nitride film 14 by, e.g., CVD. The film thickness of the polyslicon film 16 is, e.g., about 100–150 nm. The polysilicon film 16 functions as the mask for patterning the silicon nitride film 14.

Then, an anti-reflection film 18 is applied to the entire surface by, e.g., spin coating. The film thickness of the anti-reflection film 18 is, e.g., 82 nm.

Then, a photoresist film 20 is formed on the entire surface by, e.g., spin coating. The material of the photoresist film 20 is, e.g., ArF resist. The film thickness of the photoresist film 20 is, e.g., 300 nm.

Figure 1B:
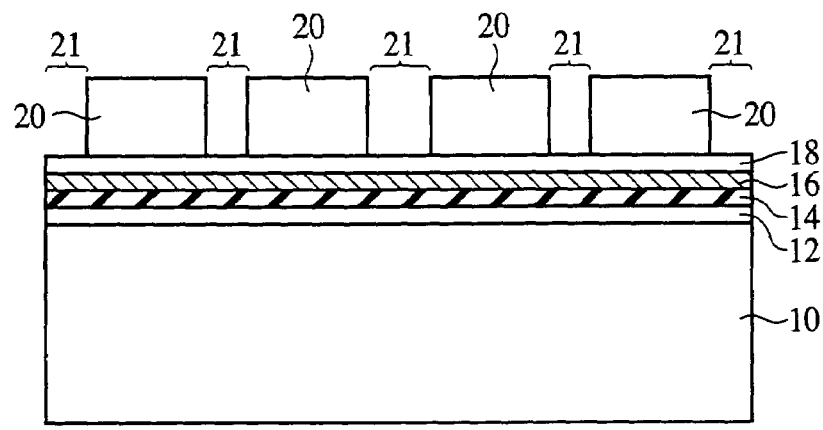

Then, openings 21 are formed in the photoresist film 20 by photolithography (refer to FIG. 1B). The openings 21 are for forming trenches 22 (refer to FIG. 3B).

Figure 1C:
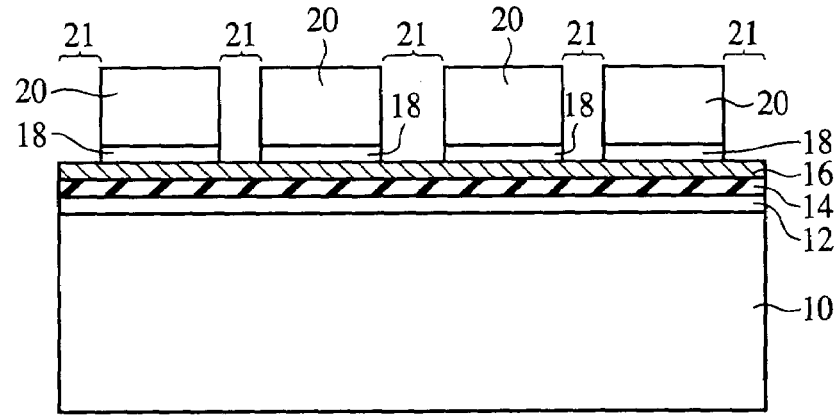

Then, as shown in FIG. 1C, with the photoresist film 20 as the mask, the anti-reflection film 18 is dry etched. Conditions for the etching are as follows. The etching gas is, e.g., a mixed gas of HBr gas, $O_2$ gas and an inert gas. The inert gas can be, e.g., He gas. The flow rate of the HBr gas is, e.g., 75 sccm. The flow rate of the He gas is, e.g., 20 sccm. The flow rate of the $O_2$ gas is, e.g., 30 sccm. The pressure inside the chamber is, e.g., 4 mT. The applied electric power is, e.g., 500 W. The bias voltage is e.g., −200 V.

Then, with the photoresist film 20 as the mask, the polysilicon film 16 is etched by, e.g., dry etching. The polysilicon film 16 is etched vertically to the plane of the semiconductor substrate 10. In etching the polysilicon film 16 with the photoresist film 20 as the mask, the technique for forming a gate electrode 40 (see FIG. 5B) of a transistor can be used, and the polysilicon film 16 can be etched with high selectivity to the photoresist film 20. Accordingly, the shoulders of the pattern of the photoresist film 20 are not largely etched. The polysilicon film 16 can be patterned into a required configuration.

When the polysilicon film 16 is etched, a pre-treatment for removing natural oxide film (not shown) on the surface of the polysilicon film 16 is performed. The pre-treatment for removing the natural oxide film is performed under, e.g., the following conditions. The etching gas is, e.g., $CF_4$ gas. The flow rate of the $CF_4$ gas is, e.g., 100 sccm. The pressure inside the chamber is, e.g., 5 mT. The applied voltage is, e.g., 200 W. The bias voltage is, e.g., −400 V. The etching time is, e.g., 10 seconds. Thus, the natural oxide film on the surface of the polysilicon film 16 can be removed.

Then, the polysilicon film 16 is etched. The etching of the polysilicon film 16 is performed under, e.g., the following conditions. The etching gas is, e.g., a mixed gas of HBr gas and $O_2$ gas. The flow rate of the HBr gas is, e.g., 180 sccm. The flow rate of the $O_2$ gas is, e.g., 5 sccm. The pressure inside the chamber is, e.g., 6 mT. The applied electric power is, e.g., 350 W. The bias voltage is, e.g., −67 V. The over etching is, e.g., about 10%.

Thus, the polysilicon film 16 can be etched with high selectivity to the photoresist film 20.

Figure 2A:
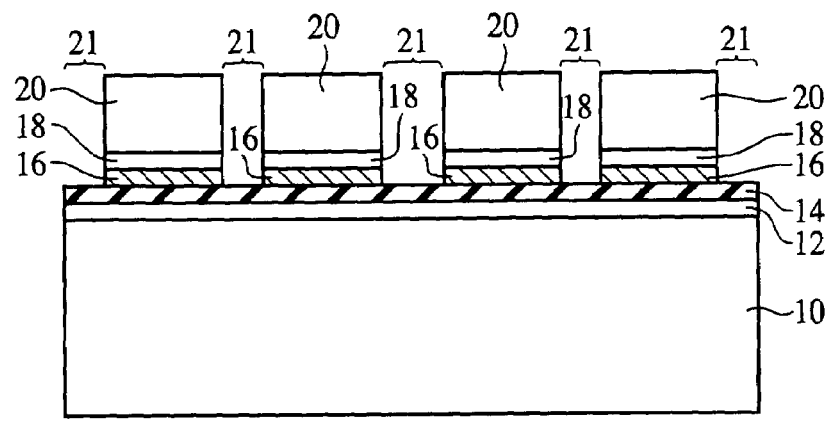
FIGS. 2A to 2C are sectional views of the semiconductor device in the steps of the semiconductor fabrication method according to the embodiment of the present invention, which show the method (Part 2).
Figure 2B:
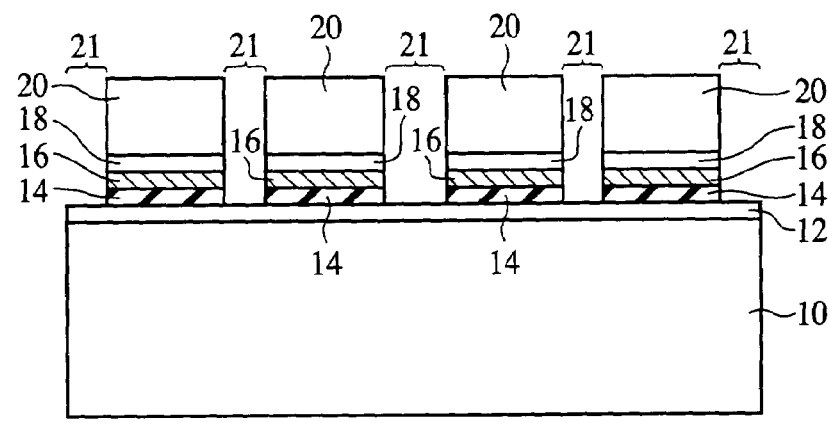

Then, as shown in FIG. 2B, with the polysilicon film 16 as the mask, the silicon nitride film 14 is dry etched. The silicon nitride film 14 can be etched with high selectivity to the polysilicon film 16, and the shoulders of the pattern of the polysilicon film 16 are not largely etched. Conditions for the etching are as, e.g., the follows. The etching gas is a mixed gas of, e.g., $CF_4$ gas, $CH_2F_2$ gas and He gas. The pressure inside the chamber is, e.g., 3.5 mT. The flow rate of the He gas is, e.g., 200 sccm. The flow rate of the $CF_4$ gas is, e.g., 25 sccm. The flow rate of the $CH_2F_2$ gas is, e.g., 25 sccm. The applied electric power is, e.g., 800 W. The bias voltage is, e.g., −410 V.

Figure 2C:
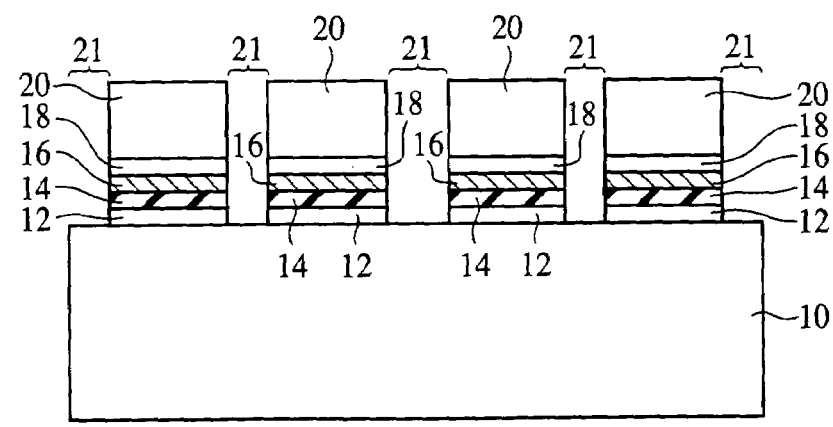

Then, as shown in FIG. 2C, with the polysilicon film 16 as the mask, the silicon oxide film 12 is dry etched. Conditions for the etching are the same as those for etching the silicon nitride film 14 with the polsysilicon film 16 as the mask. Thus, the openings 21 are formed down to the semiconductor substrate 10.

The step of etching the anti-reflection film 18, the step of etching the polysilicon film 16, the step of etching the silicon nitride film 14, the step of etching the silicon oxide film 12 are performed in one and the same chamber without exposing the interior of the chamber to the atmosphere. The etching them without the exposure to the atmosphere can suppress the adhesion of particles to the semiconductor substrate 10.

It is possible that after the anti-reflection film 18 has been etched, the semiconductor substrate 10 is transferred to another chamber to etch the polysilicon film 16, the silicon nitride film 14 and the silicon nitride film 12 there. In this case as well, it is preferable to etch the anti-reflection film 18, the polysilicon film 16, the silicon nitride film 14 and the silicon oxide film 12 without the exposure to the atmosphere. In order to perform the etching of them without the exposure to the atmosphere, a multi-chamber etching system, for example, which can transfer semiconductor substrates in a vacuum, may be used. For example, a multi-chamber etching system used in forming the gate electrode of a transistor can be used in the above-described etching steps.

Figure 3A:
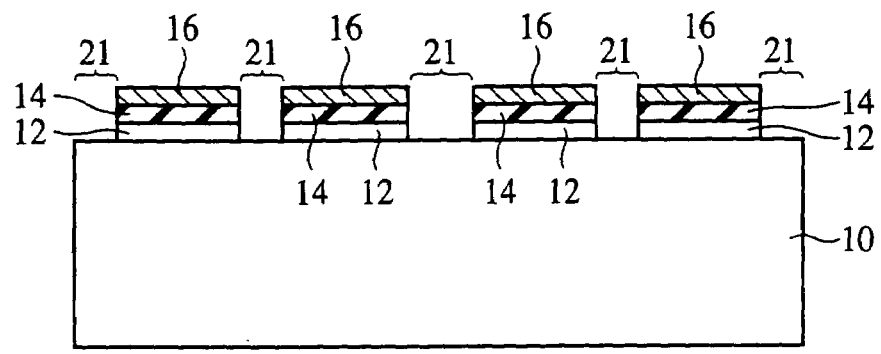
FIGS. 3A to 3C are sectional views of the semiconductor device in the steps of the semiconductor fabrication method according to the embodiment of the present invention, which show the method (Part 3).

Then, as shown in FIG. 3A, the photoresist film 20 is removed. The photoresist film 20 is removed by, e.g., a combination of wet resist release and plasma resist release. In the wet resist release, the combination of, e.g., the chemical liquid processing using a release liquid of hydrofluoric acid, chemical liquid processing using SPM (Sulfuric acid-Hydrogen Peroxide Mixture) release liquid mixing sulfuric acid and hydrogen peroxide, and chemical liquid processing using APM (Ammonia-Hydrogen Peroxide Mixture) release liquid mixing ammonia, hydrogen peroxide and water is used. In the resist release with plasmas, oxygen plasmas, for example, are used.

In the step of etching the silicon nitride film 14, because of the high applied electric power, the etching gas and the photoresist film 20 react with each other to generate reaction products, but when the photoresist film 20 is removed, these reaction products are together removed.

Figure 3B:
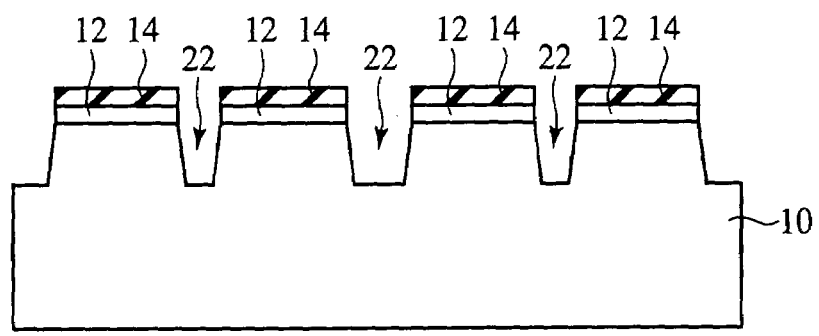
Figure 3C:
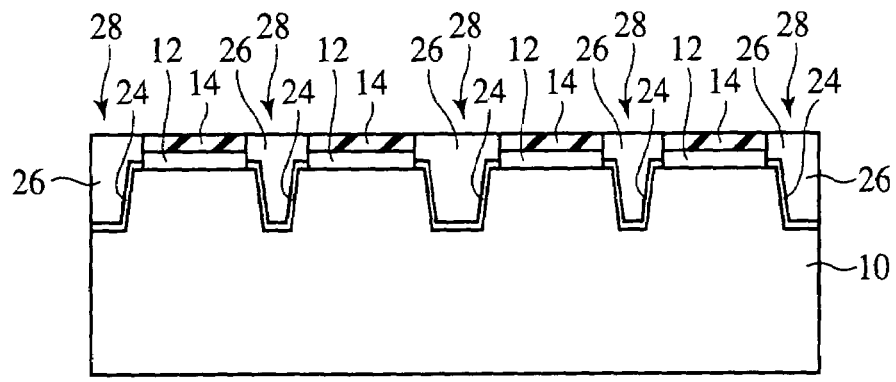

Then, as shown in FIG. 3B, with the silicon nitride film 14 as the mask, the semiconductor substrate 10 is etched.

When the semiconductor substrate 10 is etched, first of all, the pre-treatment for removing natural oxide film (not shown) on the surface of the semiconductor substrate 10 is performed. The pre-treatment for removing the natural oxide film is performed under, e.g., the following conditions. The etching gas is, e.g., $CF_4$ gas. The flow rate of the $CF_4$ gas is e.g., 100 sccm. The pressure inside the chamber is, e.g., 5 mT. The applied electric power is, e.g., 200 W. The bias voltage is, e.g., −400 V. The etching time is, e.g., 10 seconds. Thus, the natural oxide film on the surface of the semiconductor substrate 10 is removed.

Then, with the silicon nitride film 16 as the mask, the semiconductor substrate 10 is etched. The semiconductor substrate 10 is etched under, e.g., the following conditions. The etching gas is, e.g., a mixed gas of HBr gas and $O_2$ gas. The flow rate of the HBr gas is, e.g., 450 sccm. The flow rate of the $O_2$ gas is, e.g., 13 sccm. The pressure inside the chamber is, e.g., 10 mT. The applied power is, e.g., 900 W. The bias voltage is, e.g., −220 V.

Thus, trenches 22, i.e., trenches are formed in the semiconductor substrate 10. The depth of the trenches 22 is, e.g., about 300 nm. The semiconductor substrate 10 is etched with the polysilicon film 16 present on the silicon nitride film 14, whereby the trenches 22 can be formed with a high aspect ratio. When the semiconductor substrate 10 is etched to form the trenches 22, the polysilicon film 16 on the silicon nitride film 14 is gradually etched off, which makes it unnecessary to add the step of removing the polysilicon film 16. This allows semiconductor devices to be fabricated in simplified steps.

When the trenches 22 are formed in the semiconductor substrate 10, the silicon nitride film 14 is also a little etched to become a little thinner. However, the silicon nitride film 14 remains in, e.g., an about 90 nm-thickness. The silicon nitride film 14 is not much etched without any special problem.

Then, a silicon oxide film 24 is formed on the exposed surface of the semiconductor substrate 10, specifically in the inside surfaces of the trenches 22 by thermal oxidation. The film thickness of the silicon oxide film 24 is, e.g., about 10 nm.

Then, a silicon oxide film 26 is formed on the entire surface by, e.g., HDP (High Density Plasma) CVD. The film thickness of the silicon oxide film 26 is, e.g., about 500 nm.

Next, the silicon oxide film 26 is polished by, e.g., CMP until the surface of the silicon nitride film 14 is exposed. Thus, the silicon oxide film 26 is buried in the trenches 22 (refer to FIG. 3C). The polishing is stopped at the time when the silicon nitride film 14, whose polishing rate is lower than the silicon oxide film 26, is exposed, whereby the polishing can be ended with high accuracy.

Figure 4A:
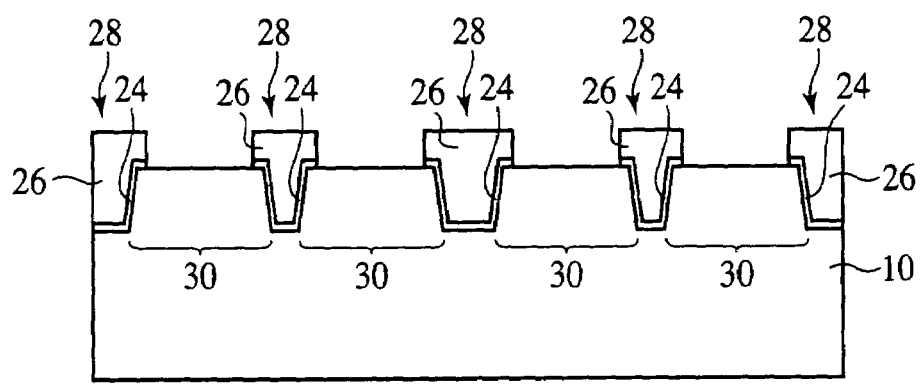
FIGS. 4A and 4B are sectional views of the semiconductor device in the steps of the semiconductor fabrication method according to the embodiment of the present invention, which show the method (Part 4).

Then, as shown in FIG. 4A, the silicon nitride film 14 is etched off. The etching liquid is, e.g., thermal phosphoric acid.

Then, the silicon oxide film 12 is etched off. The etching liquid is, e.g., diluted hydrofluoric acid. At this time, the silicon oxide film 26 in the buried in the trenches 22, i.e., the element isolation regions 28 is a little etched. Thus, the element isolation regions 28 of the silicon oxide film 26 are formed by STI. The element isolation regions 28 define the element regions.

Then, a sacrifice oxide film (not shown) is formed on the surface of the semiconductor substrate 10 by thermal oxidation.

Figure 4B:
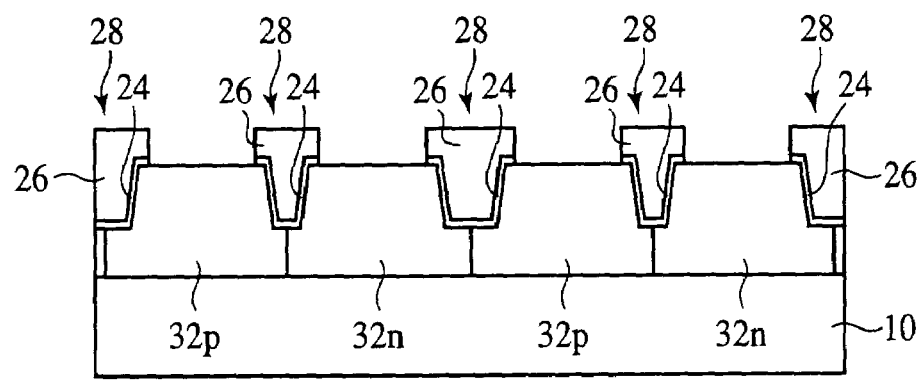

Then, a dopant is suitably implanted into the element regions 30 through the sacrifice oxide film by, e.g., ion implantation to form n-type wells 32n and p-type wells 32p (refer to FIG. 4B).

Then, the sacrifice oxide film is etched off. The etching liquid is, e.g., diluted hydrofluoric acid. At this time, the element isolation regions 28 of the silicon nitride film 26 is a little etched. Because the etching with diluted hydrofluoric acid is performed after the element isolation regions 28 have been formed, local concavities, i.e., divots 34 (refer to FIG. 5A) are formed near the ends of the element isolation regions 28.

Then, a gate insulation film 36 is formed on the element regions 30 by thermal oxidation. The film thickness of the gate insulation film 36 is, e.g., 2 nm.

Then, a polysilicon film 38 is formed on the entire surface. The film thickness of the polysilicon film 38 is, e.g., 150 nm.

Then, the photoresist film is patterned by photolithography. Then, with the photoresist film as the mask, the polysilicon film 38 is patterned. Thus, gate electrodes of the polysilicon film 38 are formed (refer to FIG. 5B).

Next, a dopant is implanted in the semiconductor substrate 10 on both sides of the gate electrode 40 with the gate electrode 40 as the mask. The conduction type of the implanted dopant is opposite to the conduction type of the wells 32. Thus, dopant diffused regions 42a forming the shallow regions of the source/drains are formed.

Then, thermal processing for activating the dopant in the dopant diffused region 42a is performed.

Then, a silicon oxide film 44 is formed on the entire surface by, e.g., CVD.

Next, a silicon nitride film 46 is formed on the entire surface by, e.g., CVD.

Next, the silicon nitride film 64 and the silicon oxide film 44 are anisotropically etched to form a sidewall spacer 48 on the side wall of the gate electrode 40.

Next, with the gate electrode 40 and the sidewall spacer 48 as the mask, a dopant is implanted in the semiconductor substrate 10 by ion implantation. The conduction types of the implanted dopant are opposite to the conduction types of the wells 32. Thus, dopant diffused regions 42b form the deep regions of the source/drain. The shallow dopant diffused regions 42a and the deep dopant diffused regions 42b form the source/drain diffused layer 42.

Figure 5A:
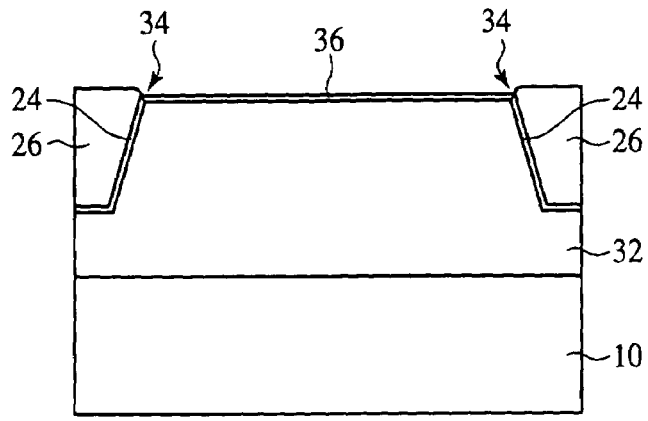
FIGS. 5A to 5C are sectional views of the semiconductor device in the steps of the semiconductor fabrication method according to the embodiment of the present invention, which show the method (Part 5).
Figure 5B:
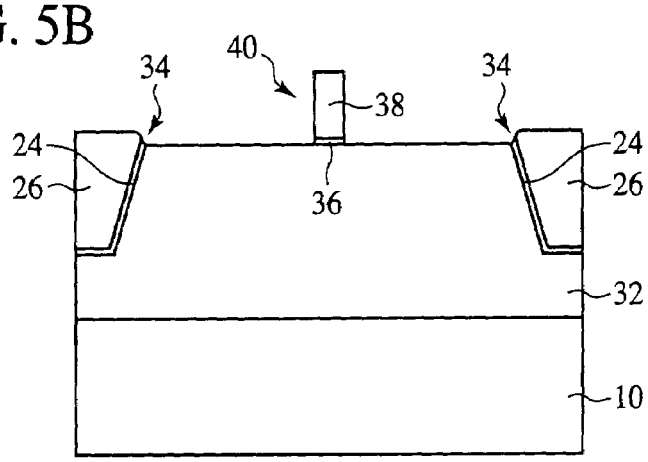
Figure 5C:
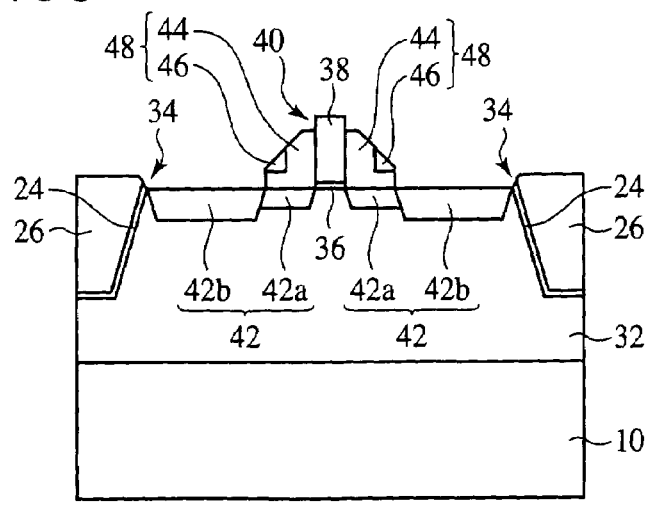
Figure 6A:
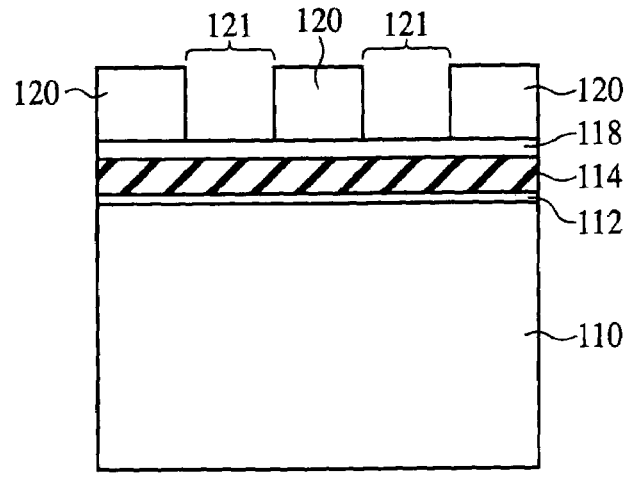
FIGS. 6A to 6C are sectional views of a semiconductor device in the steps of the proposed semiconductor device fabrication method (Part 1).
Figure 6B:
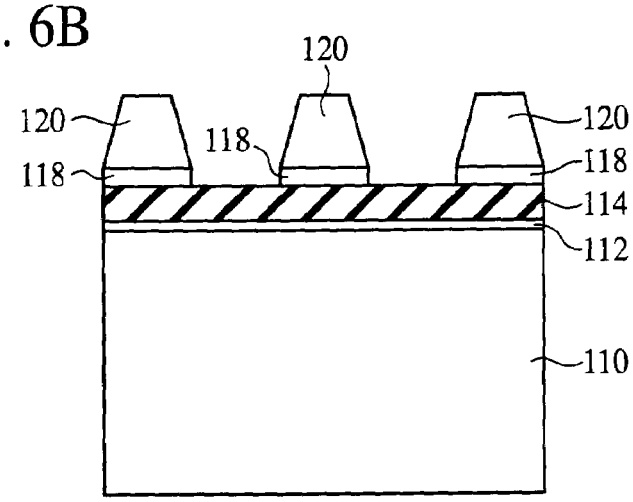
Figure 6C:
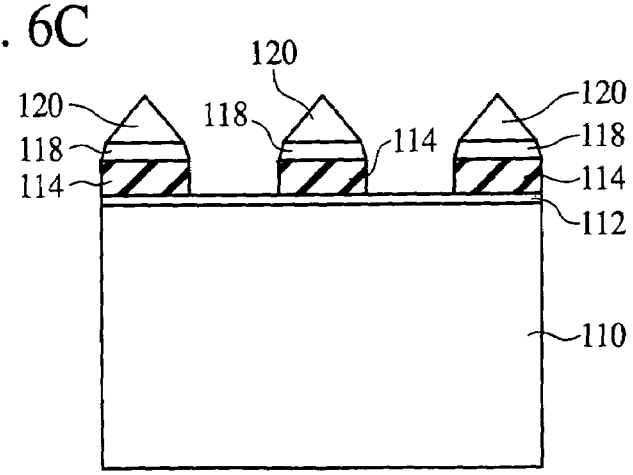
Figure 7A:
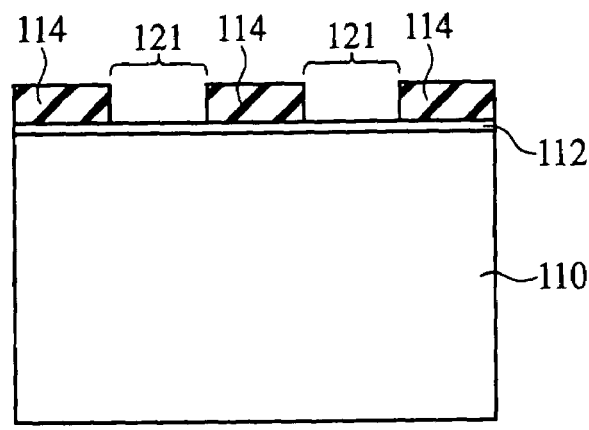
FIGS. 7A to 7C are sectional views of the semiconductor device in the steps of the proposed semiconductor device fabrication method (Part 2).
Figure 7B:
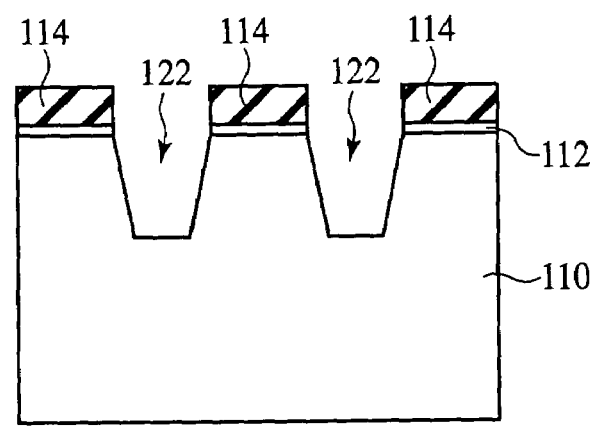
Figure 7C:
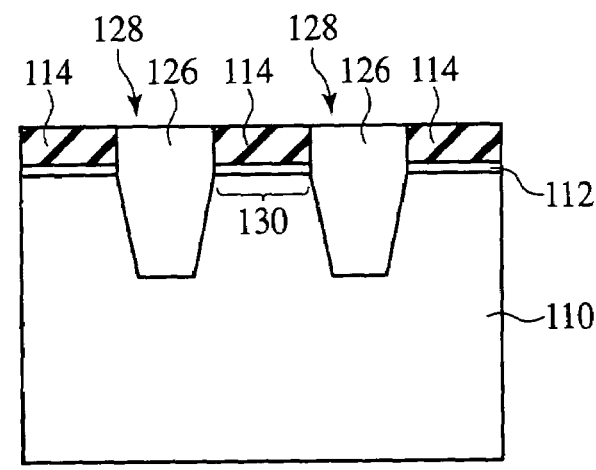

Thus, the semiconductor device of the present embodiment is fabricated (refer to FIG. 5C).

The semiconductor device fabrication method according to the present embodiment is characterized mainly in that silicon nitride film is etched with the mask of polysilicon film.

In the proposed semiconductor device fabrication method, making the width of the photoresist film 120 smaller for micronization often causes the photoresist film 120 to collapse when the silicon nitride film 114 is dry etched using the photoresist film 120. On the other hand, forming the photoresist film 120 thin can prevent the collapse of the photoresist film 120, but because of the etching selectivity of the silicon nitride film 114 to the photoresist film 120 which is not always high, the photoresist film 120 gradually extinguishes while the silicon nitride film 114 is being etched. Then, the shoulders of the silicon nitride film 114 are largely etched, or the side wall of the silicon nitride film 114 is roughened. That is, the silicon nitride film 114 cannot be patterned in a required configuration. The silicon nitride film 114 cannot be patterned in a required pattern, which makes it impossible to form the trenches in a required configuration. Thus, the proposed semiconductor device fabrication method has found it difficult to form good further micronized element isolation regions.

In contrast to this, according to the present embodiment, the silicon nitride film 14 is patterned using the mask of the polysilicon film 16, which makes to possible to etch the silicon nitride film 14 with high selectivity to the polysilicon film 16. Accordingly, a pattern of the silicon nitride film 14 can be formed. Thus, according to the present embodiment, even when micronized trenches 22 are formed in the semiconductor substrate 10 with the silicon nitride film 14 as the mask, the trenches 22 can be formed in a required configuration. According to the present embodiment, further micronized good element isolation regions can be formed.

The semiconductor device fabrication method according to the present embodiment is also characterized mainly in that when the trenches 22 are formed in the semiconductor substrate 10, the polysilicon film 16 on the silicon nitride film 14 can be removed together.

According to the present embodiment, when the trenches 22 are formed, the polysilicon film 16 present on the silicon nitride film 14 can be removed, which makes it unnecessary to add the step removing the polysilicon film 16. Thus, the present embodiment can fabricate semiconductor devices in simplified steps.

The semiconductor device fabrication method according to the present embodiment is also characterized mainly in that the step of etching the anti-reflection film 18, the step of etching the polysilicon film 16, the step of etching the silicon nitride film 14 and the step of etching the silicon oxide film 12 are performed without the exposure to the atmosphere.

According tot the present embodiment, these etching steps are performed without the exposure to the atmosphere, which can prevent the adhesion of particles to the surface of the semiconductor substrate, and semiconductor devices can be fabricated with high yields. Since the step of removing the particles is not necessary, which allows semiconductor devices to be fabricated with high throughputs.

Patent Reference 1 discloses a technique for forming trenches in a semiconductor substrate by etching a TEOS oxide film, a silicon nitride film and a silicon oxide film with a polysilicon film as the mask to form a mask for forming element isolation trenches of the silicon oxide film, the silicon nitride film and the TEOS oxide film, and etching the semiconductor substrate with the mask for forming the element isolation trenches to form the trenches in the semiconductor substrate. However, in the technique described in Patent Reference 1, when the TEOS oxide film, the silicon nitride film and the silicon oxide film are etched with the photoresist film, the anti-reflection film and the polysilicon film as the mask, the TEOS oxide film, the silicon nitride film and the silicon oxide film are not etched with not so high selectivity to the photoresist film, the anti-reflection film and the polysilicon film. Accordingly, when the mask for forming the element isolation trenches is formed, the shoulders of the polysilicon film are largely etched off, and consequently the shoulders of the mask for forming the element isolation trenches are also etched off. In the technique described in Patent Reference 1, the shoulders of the mask for forming the element isolation trenches are also etched off, which makes it difficult to form the element isolation grooves, i.e., the trenches in a required configuration. Furthermore, when the shoulders of the mask for forming the element isolation trenches are etched off, removing the mask for forming the element isolation trenches after the silicon oxide film has been buried in the trenches the ends of the element isolation regions of the silicon oxide film are projected horizontally in the element regions. The horizontal projection of the ends of the element isolation regions tends to cause residues of polysilicon, etc. at the horizontally extended ends of the element isolation regions, in a later step of forming the gate electrode. This has been a cause for fabrication yield decrease of semiconductor devices.

In contrast to this, in the semiconductor device fabrication method according to the present embodiment, when a mask of silicon nitride film is formed, the silicon nitride film is etched with high selectivity to polysilicon film, which can prevent the shoulders of a pattern of the silicon nitride film from being largely etched. Accordingly, the present embodiment can form the trenches in a required configuration and can provide micronized semiconductor devices with high fabrication yields.

[Modified Embodiments]

The present invention is not limited to the above-described embodiment and can cover other various modifications.

For example, the photoresist film 20 may be removed after the step of etching the polysilicon film 16 and before the step of etching the silicon nitride film 14. In this case, the reaction products generated by the etching gas reacting with the photoresist film when the polysilicon film 16 is etched can be removed simultaneously with removing the photoresist film 20. This makes it possible to etch the silicon nitride film 14 without the reaction products adhering.

In the above-described embodiment, the mask of the polysilicon film 18 is used to pattern the silicon nitride film 14, but the material of the mask is not essentially polysilicon. For example, any silicon film, such as amorphous silicon film or others, can be used as the material of the mask for etching the silicon nitride film 14. The material of the mask for etching the silicon nitride film 14 is not limited to silicon and can be any semiconductor. For example, the material of the mask can be a semiconductor having substantially the same etching characteristics as the material of the semiconductor substrate 10. Using of a semiconductor material having substantially the same etching characteristics as the material of the semiconductor substrate 10 makes it possible to remove the mask of a semiconductor present on the silicon nitride film 14 to be concurrently removed when the trenches 22 are formed in the semiconductor substrate 10 with the silicon nitride film 14 as the mask.

In the above-described embodiment, a silicon substrate is used as the semiconductor substrate. However, the present invention is not limited to the case using silicon substrates and is applicable to cases using semiconductor substrates.

What is claimed is:

1. A method for fabricating a semiconductor device comprising the steps of:
   forming a silicon nitride film over a semiconductor substrate;
   forming a semiconductor film on the silicon nitride film;
   forming a resist film over the semiconductor film;
   forming openings in the resist film;
   etching the semiconductor film with the resist film as a mask;
   etching the silicon nitride film with the semiconductor film as a mask; and
   etching the semiconductor substrate with the silicon nitride film as a mask to form trenches in the semiconductor substrate.

2. A method for fabricating a semiconductor device according to claim 1,
   which further comprises, after the step of forming the trenches in the semiconductor substrate, the step of burying element isolation regions of an insulation film in the trenches.

3. A method for fabricating a semiconductor device according to claim 1, wherein
   in the step of forming trenches in the semiconductor substrate, the trenches are formed in the semiconductor substrate and etching off the semiconductor film over the silicon nitride film.

4. A method for fabricating a semiconductor device according to claim 2, wherein
   in the step of forming trenches in the semiconductor substrate, the trenches are formed in the semiconductor substrate and etching off the semiconductor film over the silicon nitride film.

5. A method for fabricating a semiconductor device according to claim 1, wherein
   the step of etching the semiconductor film and the step of etching the silicon nitride film are performed without the exposure to the atmosphere.

6. A method for fabricating a semiconductor device according to claim 2, wherein
   the step of etching the semiconductor film and the step of etching the silicon nitride film are performed without the exposure to the atmosphere.

7. A method for fabricating a semiconductor device according to claim 5, wherein
   the step of etching the semiconductor film and the step of etching the silicon nitride film are performed in one and the same chamber.

8. A method for fabricating a semiconductor device according to claim 6, wherein
   the step of etching the semiconductor film and the step of etching the silicon nitride film are performed in one and the same chamber.

9. A method for fabricating a semiconductor device according to claim 5,
   which further comprises, after the step of forming a semiconductor film and before the step of forming a resist film, the step of forming an anti-reflection film, and
   in which the step of etching the anti-reflection film to the step of etching the silicon nitride film including the silicon nitride film etching step are performed without exposure to the atmosphere.

10. A method for fabricating a semiconductor device according to claim 6,
    which further comprises, after the step of forming a semiconductor film and before the step of forming a resist film, the step of forming an anti-reflection film, and
    in which the step of etching the anti-reflection film to the step of etching the silicon nitride film including the silicon nitride film etching step are performed without exposure to the atmosphere.

11. A method for fabricating a semiconductor device according to claim 9, wherein
    the step of etching the anti-reflection film to the step of etching the silicon nitride film including the silicon nireide film etching step are performed in one and the same chamber.

12. A method for fabricating a semiconductor device according to claim 10, wherein
    the step of etching the anti-reflection film to the step of etching the silicon nitride film including the silicon nitride film etching step are performed in one and the same chamber.

13. A method for fabricating a semiconductor device according to claim 1,
    which further comprises, after the step of etching the silicon nitride film and before the step of forming the trenches in the semiconductor substrate, the step of removing the resist film.

14. A method for fabricating a semiconductor device according to claim 2,
    which further comprises, after the step of etching the silicon nitride film and before the step of forming the trenches in the semiconductor substrate, the step of removing the resist film.

15. A method for fabricating a semiconductor device according to claim 1,
    which further comprises, after the step of etching the semiconductor film and before the step of etching the silicon nitride film, the step of removing the resist film.

16. A method for fabricating a semiconductor device according to claim 2,
    which further comprises, after the step of etching the semiconductor film and before the step of etching the silicon nitride film, the step of removing the resist film.

17. A method for fabricating a semiconductor device according to claim 2, wherein
    the step of burying the element isolation regions comprises the step of forming the insulation film in the trenches and on the silicon nitride film and the step of polishing the insulation film until the silicon nitride film is exposed.

18. A method for fabricating a semiconductor device according to claim 1, which further comprises, after the step of forming element isolation regions, the steps of:
    etching off the silicon nitride film; and
    forming a gate insulation film over the semiconductor substrate.

19. A method for fabricating a semiconductor device according to claim 1, wherein
    the semiconductor film is a polysilicon film or an amorphous silicon film.

20. A method for fabricating a semiconductor device according to claim 2, wherein
    the insulation film is a silicon oxide film.

* * * * *